(12) United States Patent
Ambrosi et al.

(10) Patent No.: US 12,014,774 B2
(45) Date of Patent: Jun. 18, 2024

(54) MEMORY SELECTOR THRESHOLD VOLTAGE RECOVERY

(71) Applicant: Taiwan Semiconductor Manufacturing Co., Ltd., Hsinchu (TW)

(72) Inventors: Elia Ambrosi, Hsinchu (TW); Cheng-Hsien Wu, Hsinchu (TW); Hengyuan Lee, Hsinchu (TW); Xinyu Bao, Fremont, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 135 days.

(21) Appl. No.: 17/658,701

(22) Filed: Apr. 11, 2022

(65) Prior Publication Data

US 2023/0253038 A1    Aug. 10, 2023

Related U.S. Application Data

(60) Provisional application No. 63/267,621, filed on Feb. 7, 2022.

(51) Int. Cl.
*G11C 13/00* (2006.01)
*H10N 70/20* (2023.01)
(Continued)

(52) U.S. Cl.
CPC ........ *G11C 13/003* (2013.01); *G11C 13/0004* (2013.01); *G11C 13/0033* (2013.01);
(Continued)

(58) Field of Classification Search
CPC .............. G11C 13/003; G11C 13/0004; G11C 13/0033; G11C 13/004; G11C 2013/0092; G11C 2213/15
See application file for complete search history.

(56) References Cited

U.S. PATENT DOCUMENTS 9,824,767 B1 * 11/2017 Mantegazza ........... G11C 16/10
10,163,506 B2 * 12/2018 Pirovano ............ G11C 13/0004
(Continued)

OTHER PUBLICATIONS

Chai, Z. et al. "Evidence of Filamentary Switching and Relaxation Mechanisms in GexSe1-x OTS Selectors," 2019 Symposium on VLSI Technology Digest of Technical Papers, 2019, T18-5, T238-T239.
(Continued)

*Primary Examiner* — Mushfique Siddique
(74) *Attorney, Agent, or Firm* — Slater Matsil, LLP

(57) ABSTRACT

A method includes applying a first voltage pulse across a memory cell, wherein the memory cell includes a selector, wherein the first voltage pulse switches the selector into an on-state; after applying the first voltage pulse, applying a second voltage pulse across the memory cell, wherein before applying the second voltage pulse the selector has a first voltage threshold, wherein after applying the second voltage pulse the selector has a second voltage threshold that is less than the first voltage threshold; and after applying the second voltage pulse, applying a third voltage pulse across the memory cell, wherein the third voltage pulse switches the selector into an on-state; wherein the selector remains continuously in an off-state between the first voltage pulse and the third voltage pulse.

20 Claims, 14 Drawing Sheets

(51) Int. Cl.
*H10B 63/00* (2023.01)
*H10N 70/00* (2023.01)

(52) U.S. Cl.
CPC ........ *G11C 13/004* (2013.01); *G11C 13/0069* (2013.01); *H10N 70/231* (2023.02); *G11C 2013/0092* (2013.01); *G11C 2213/15* (2013.01); *H10B 63/84* (2023.02); *H10N 70/826* (2023.02)

(56) References Cited

U.S. PATENT DOCUMENTS

| | | | |
|---|---|---|---|
| 2009/0244962 A1* | 10/2009 | Gordon | G11C 13/0004 365/163 |
| 2018/0012652 A1* | 1/2018 | Yang | H10N 70/8828 |
| 2018/0331284 A1 | 11/2018 | BrightSky et al. | |
| 2019/0206506 A1* | 7/2019 | Tortorelli | H10N 70/231 |
| 2020/0194501 A1* | 6/2020 | Ge | H10N 70/821 |
| 2021/0134362 A1* | 5/2021 | Diaz | G11C 13/0004 |

OTHER PUBLICATIONS

Ciocchini, Nicola et al., "Evidence for Non-Arrhenius Kinetics of Crystallization in Phase Change Memory Devices," IEEE Transactions on Electron Devices, vol. 60, No. 11, Nov. 2013, pp. 3767-3774.

Laudato, M. et al., "ALD GeAsSeTe Ovonic Threshold Switch for 3D Stackable Crosspoint Memory," 2020 IEEE International Memory Workshop (IMW), May 17-20, 2020, 4 pages.

\* cited by examiner

MEMORY SELECTOR THRESHOLD VOLTAGE RECOVERY

PRIORITY CLAIM AND CROSS-REFERENCE

This application claims the benefit of U.S. Provisional Application No. 63/267,621, filed on Feb. 7, 2022, which application is hereby incorporated herein by reference.

BACKGROUND

Semiconductor memories are used in integrated circuits for electronic applications, including radios, televisions, cell phones, and personal computing devices, as examples. One type of semiconductor memory is phase-change random access memory (PCRAM), which involves storing values in phase change materials, such as chalcogenide materials. Phase change materials can be switched between an amorphous phase (in which they have a high resistivity) and a crystalline phase (in which they have a low resistivity) to indicate bit codes. A PCRAM cell typically includes a phase change material (PCM) element between two electrodes. However, PCRAM cell selectors can be affected by a threshold voltage drift issue, in which the threshold voltage of the PCRAM cell drifts to higher values as a function of the elapsed time from a previous switching pulse (e.g., the delay time). For reliable device operation, it is beneficial to stabilize the threshold voltage over a broad range of delay times.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
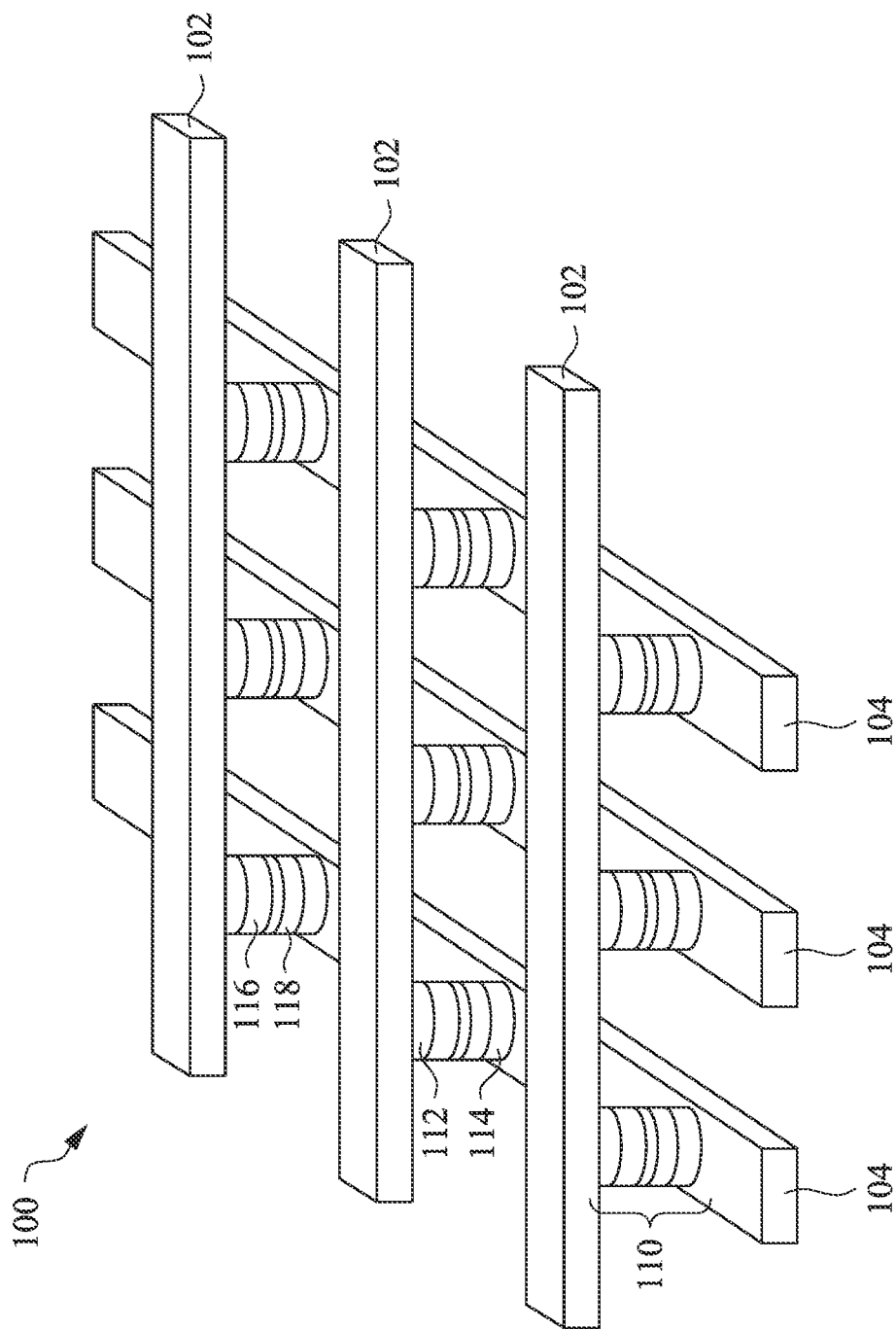
FIG. 1 illustrates a perspective view of a memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a subthreshold voltage stress is applied to a threshold-type memory selector to counteract time delay threshold voltage drift. For example, the threshold voltage of a selector may increase during a time delay between switching pulses, and applying a subthreshold voltage stress as described herein can reduce the increased threshold voltage back toward a no-delay value. The subthreshold stress includes a voltage less than the threshold voltage of the selector, which can reduce the stressing of the selector, reduce power consumption, and reduce the chance of switching on the selector. The subthreshold voltage stress may also be a voltage with a polarity opposite to the switching voltage of the selector. By reducing threshold voltage using a subthreshold voltage stress as described herein, device uniformity, repeatability, or efficiency may be improved.

FIG. 1 illustrates a perspective view of a Phase-Change Random Access Memory (PCRAM) array 100, in accordance with some embodiments. The PCRAM array 100 comprises word lines 102, bit lines 104, and PCRAM cells 110 connected in a "cross-point" configuration. Other configurations of word lines 102, bit lines 104, or PCRAM cells 110 are possible. In some embodiments, multiple PCRAM arrays 100 may be stacked to create a 3D memory array (not shown). The PCRAM array 100 may be formed on a substrate (not shown), which may be a semiconductor substrate or another type of substrate. The substrate may include active and/or passive devices (e.g., transistors, diodes, capacitors, resistors, or the like), in some embodiments. The devices may be formed according to applicable manufacturing processes. In some embodiments, no devices are formed in the substrate. In some embodiments, the PCRAM array 100 is formed in the metallization layers of an interconnect structure (not shown) over the substrate. The PCRAM array may be electrically connected to one or more of the metallization layers. For example, in some embodiments, the word lines 102 and/or the bit lines 104 may be conductive lines of the metallization layers.

Figure 2A:
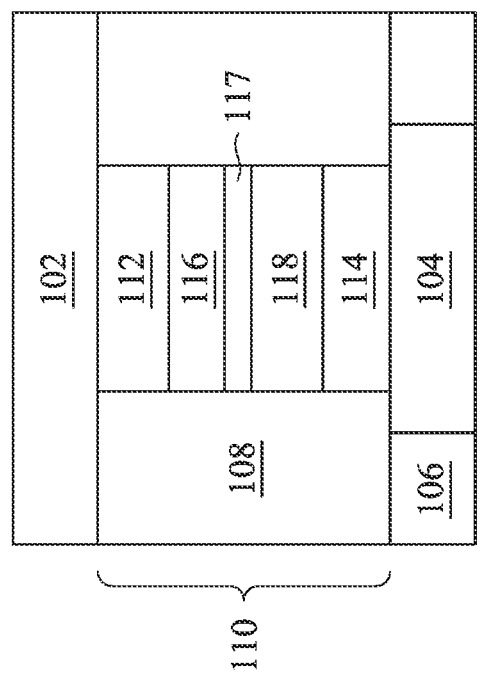
FIGS. 2A and 2B illustrate cross-sectional views of memory cells, in accordance with some embodiments.
Figure 2B:
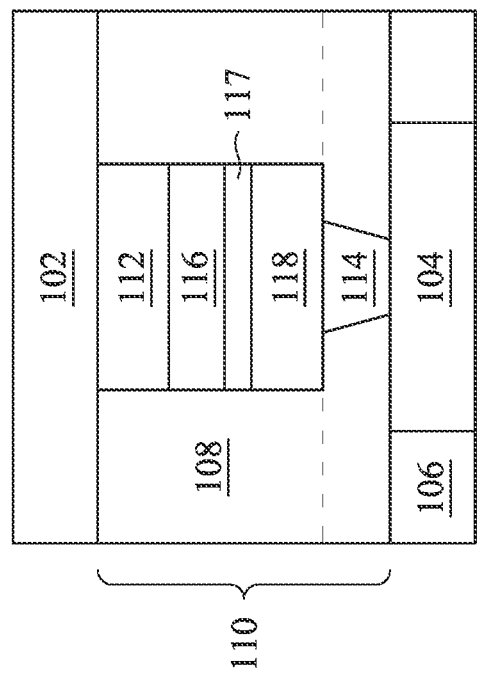

In the embodiment shown in FIG. 1, each PCRAM cell 110 comprises a top electrode 112, a bottom electrode 114, an ovonic threshold switching (OTS) layer 116, and a phase-change material (PCM) layer 118, described in greater detail below for FIGS. 2A-2B. The bit lines 104 are electrically connected to the bottom electrodes 114 of respective columns of PCRAM cells 110 in the PCRAM array 100. Each column of the PCRAM array 100 has an associated bit line 104, and the PCRAM cells 110 in a column are connected to the bit line 104 for that column. The word lines 102 are connected to the top electrodes 112 of respective rows of PCRAM cells 110 in the PCRAM array 100. Each row of the PCRAM array 100 has an associated word line 102, and the PCRAM cells 110 in a row are connected to the word line 102 for that row. In this manner, each PCRAM cell 110 of the PCRAM array 100 may be selected by the appropriate combination of word line 102 and bit line 104. For example, a particular PCRAM cell 110 may be selected (e.g., for reading or writing operations) by accessing the single word line 102 connected to that PCRAM cell 110 and also accessing the single bit line 104 connected to that PCRAM cell 110.

In some embodiments, the resistance of the PCM layer 118 of each PCRAM cell 110 is programmable, and can be changed between a high-resistance state and a low-resistance state, which can correspond to the two states of a binary code. In some embodiments, the resistance state of the PCM layer 118 of a PCRAM cell 110 can be programmed (e.g., "written") by applying an appropriate electrical voltage pulse across the PCRAM cell 110 that generates a corresponding electrical current pulse across the PCM layer 118. In some embodiments, the magnitude of a programming current pulse is in the range of about 50 µA to about 800 µA, though other currents are possible. In some cases, the magnitude of a programming voltage pulse may be in the range of about 1 V to about 2 V, though other voltages are possible. In some embodiments, the state of a PCRAM cell 110 may be read by applying a relatively small electrical current across the PCRAM cell 110 that allows the resistance of the PCRAM cell 110 to be measured without disturbing the resistance state of the PCM layer 118. Other types of memory or memory architecture may use different read schemes or magnitudes than this example.

The OTS layer 116 of each PCRAM cell 110 is used as a selector that allows the respective PCRAM cell 110 to be accessed (e.g., written or read) individually. In this manner, an OTS layer 116 of a PCRAM cell 110 may also be referred to herein as an "OTS selector 116." An OTS selector 116 has a characteristic property called the threshold voltage ($V_{TH}$). At applied voltages below $V_{TH}$ (e.g., at subthreshold voltages), the OTS selector 116 is in a high-resistance state, limiting current through the PCRAM cell 110. At applied voltages greater than $V_{TH}$, the OTS selector 116 is in a low-resistance state that creates a current path through the PCRAM cell 110 for write or read operations. In this manner, write operations may be performed on a PCRAM cell 110 only when the voltage across the OTS selector 116 is greater than $V_{TH}$. In some cases, a PCRAM cell 110 may be read using subthreshold voltages. In some embodiments, the magnitude of the threshold voltage $V_{TH}$ is in the range of about 1 V to about 2 V, though other voltages are possible.

In some cases, the threshold voltage $V_{TH}$ can be tuned, for example, by adjusting the materials or thicknesses of the various layers.

Figure 3:
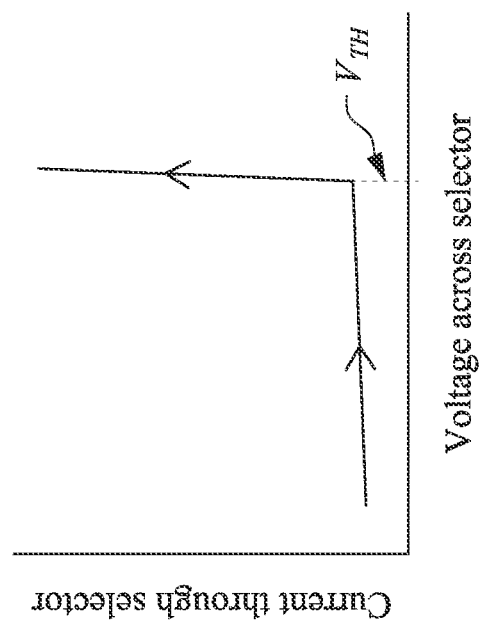
FIG. 3 illustrates a graph of the current-voltage characteristic of a selector, in accordance with some embodiments.

Turning briefly to FIG. 3, an example graph of the current across an OTS selector 116 as a function of the voltage applied across the selector is shown. FIG. 3 is a representative graph for explanatory purposes, and OTS selectors 116 may have a different current-voltage characteristics than shown. As illustrated in FIG. 3, an OTS selector 116 is in a low-conductivity state (e.g., an "off" state) unless a voltage above the on-state threshold voltage $V_{TH}$ is applied, at which point the OTS selector 116 enters a high-conductivity state (e.g., an "on" state). The OTS selector 116 returns to the low-conductivity state when the applied voltage is removed or reduced below an off-state threshold voltage (also sometimes referred to as a "holding voltage"). The off-state threshold voltage may be the same as or different from the on-state threshold voltage $V_{TH}$. The threshold voltage $V_{TH}$ of an OTS selector 116 of a PCRAM cell 110 may also be referred to herein as the threshold voltage $V_{TH}$ of the PCRAM cell 110.

Turning back to FIGS. 2A and 2B, cross-sectional views of PCRAM cells 110 are illustrated, in accordance with some embodiments. The PCRAM cells 110 in FIGS. 2A and 2B may be used in a PCRAM array such as the PCRAM array shown in FIG. 1, or the like. The PCRAM cells 110 each comprise a top electrode 112, a bottom electrode 114, an OTS layer 116, a PCM layer 118, and an intermediate electrode 117. One or more layers of insulating material 108 may surround and protect the PCRAM cells 110, and may comprise one or more inter-metal dielectric (IMD) layers and/or one or more layers of oxide, nitride, or the like. FIG. 2A illustrates a PCRAM cell 110 having a "symmetric" or "pillar" shape, and FIG. 2B illustrates a PCRAM cell 110 having an "asymmetric" or "mushroom" shape with a narrower bottom electrode 114. The PCRAM cells 110 shown in FIGS. 2A and 2B are non-limiting examples, and PCRAM cells 110 may have other layers, widths, configurations, dimensions, shapes, or configurations in other embodiments.

In some embodiments, the bit lines 104 may be formed in an insulating layer 106, which may be an inter-metal dielectric (IMD) layer, or the like. The bit lines 104 may be formed of one or more conductive materials such as tungsten, titanium, tantalum, ruthenium, cobalt, nickel, the like, or combinations thereof, and may be deposited by a suitable process such as CVD, PVD, ALD, plating, or the like. The bit lines 104 may be formed using a suitable process, such as damascene, dual-damascene, or another process.

In some embodiments, the bottom electrodes 114, the PCM layer 118, the intermediate electrode 117, the OTS layer 116, and the top electrodes 112 are blanket deposited and then patterned together to form individual PCRAM cells 110. The insulating material 108 may then be deposited around the PCRAM cells 110. This process may form a pillar-shaped PCRAM cell 110 such as that shown in FIG. 2A, for example. In other embodiments, one or more layers of the PCRAM cells 110 may be formed or patterned separately. This process may form a PCRAM cell 110 having layers of different widths, such as the mushroom-shaped PCRAM cell 110 shown in FIG. 2B, in which the bottom electrodes 114 are formed and then the other layers of the PCRAM cell 110 are patterned in a separate step. For example, the bottom electrodes 114 may be formed first by etching a trench in a layer of insulating material 108 and filling the trench with conductive material. Other techniques are possible.

The bottom electrodes 114 are formed on the bit lines 104. The bottom electrodes 114 may be formed from one or more conductive materials similar to those described for the bit lines 104, and may be formed using similar processes. In some embodiments, the bottom electrodes 114 may include a barrier layer (not shown). The PCM layer 118 is formed on the bottom electrodes 114. In some embodiments, the PCM layer 118 is formed of a chalcogenide material. Chalcogenide materials include at least a chalcogen anion (e.g., selenium (Se), tellurium (Te), or the like) and an electropositive element (e.g., germanium (Ge), silicon (Si), phosphorus (P), arsenic (As), antimony (Sb), bismuth (Bi), zinc (Zn), nitrogen (N), boron (B), carbon (C), or the like). An acceptable chalcogenide material includes, but is not limited to, GeSbTe (GST) or GeSbTeX, in which X is a material such as Ag, Sn, In, Si, N, or the like. Other materials are possible. The PCM layer 118 may be formed using a suitable deposition process, such as PVD, CVD, plasma-enhanced CVD (PECVD), ALD, or the like.

In some embodiments, an intermediate electrode 117 is formed on the PCM layer 118. The intermediate electrode 117 may be formed using materials or techniques similar to those described for the bottom electrodes 114. The OTS layer 116 is formed on the intermediate electrode 117. The OTS layer 116 may be formed of one or more materials similar to those described above for the PCM layer 118. For example, the OTS layer 116 may be formed of a chalcogenide material, which may be a similar material or a different material than the PCM layer 118. The OTS layer 116 may be formed using a suitable deposition process, such as PVD, CVD, PECVD, ALD, or the like.

The top electrodes 112 are formed on the OTS layer 116. The top electrodes 112 may be formed using materials or techniques similar to those described for the bottom electrodes 114. The word lines 102 may then be formed on the top electrodes 112. The word lines 102 may be formed using similar materials or techniques as the bit lines 104, in some embodiments. Other materials or techniques are possible.

Figure 4:
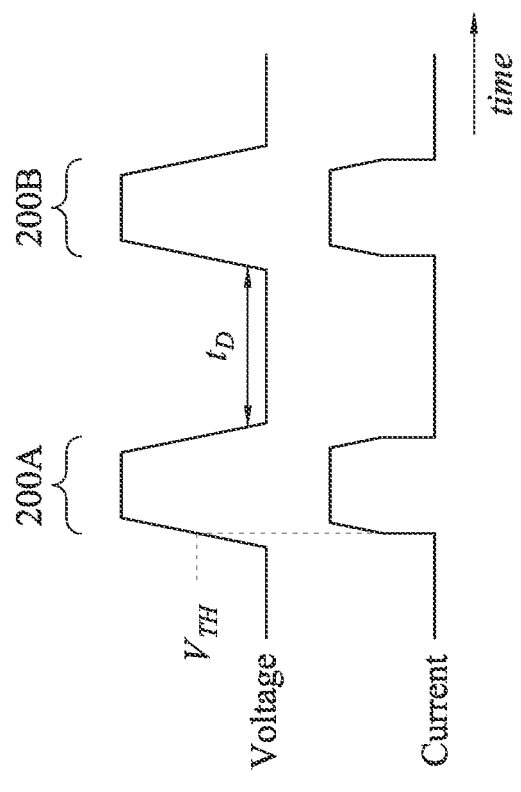
FIG. 4 illustrates a graph of the voltage and current across a selector, in accordance with some embodiments.

Turning to FIG. 4, a representative graph of voltage and current of an OTS selector 116 (e.g., the OTS layer 116) of a PCRAM cell 110 is shown, in accordance with some embodiments. The graph of FIG. 4 illustrates, as a function of time, a voltage applied across an OTS selector 116 and the corresponding current through the OTS selector 116. FIG. 4 is a representative graph for explanatory purposes, and OTS selectors 116 may have a different current-voltage characteristics than shown. FIG. 4 illustrates a first voltage pulse 200A followed by a second voltage pulse 200B. Both pulses 200A-B may be voltage pulses used for programming the PCRAM cell 110, and thus both pulses 200A-B include voltages greater than the threshold voltage $V_{TH}$ of the OTS selector 116 of the PCRAM cell 110. As shown in FIG. 4, the second pulse 200B is applied after a delay time $t_D$ has elapsed from the completion of the first pulse 200A. Depending on the particular application or operation of the PCRAM array 100, a delay time $t_D$ between two subsequent voltage pulses applied to a PCRAM cell 110 may encompass a wide range, such as a $t_D$ as short as a fraction of a second (e.g., microseconds or less) or a $t_D$ as long as many thousands of seconds (e.g., weeks or longer).

Figures 5A, 5B:
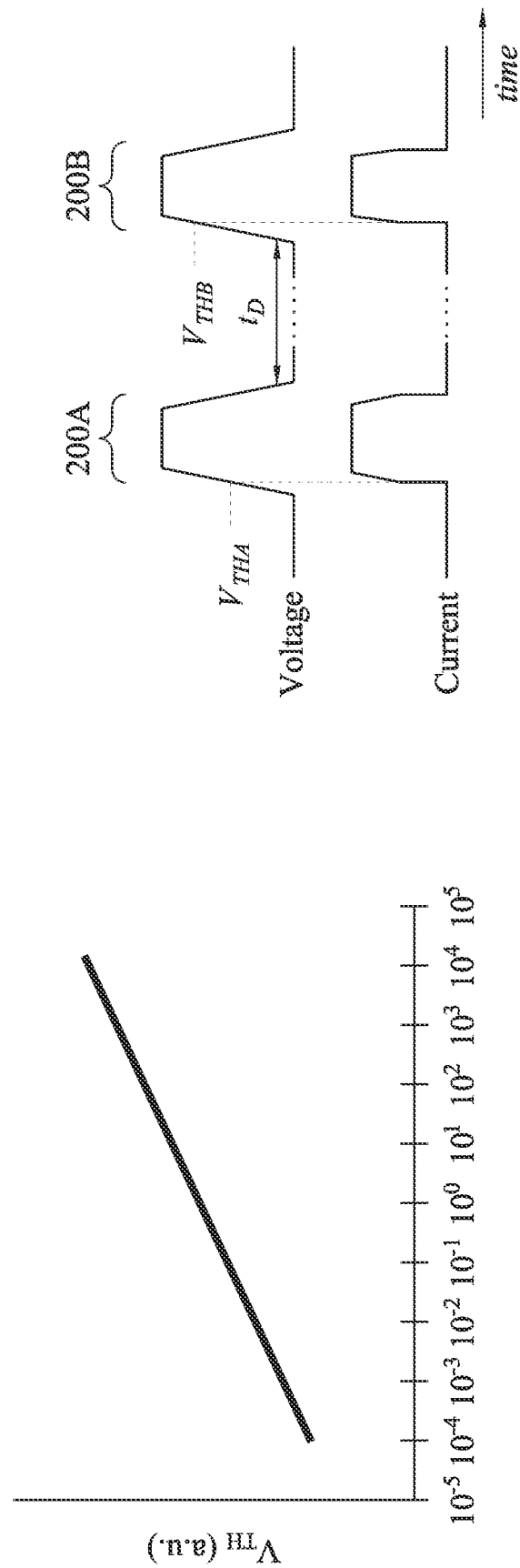
FIG. 5A illustrates a graph of threshold voltage vs. delay time of a selector, in accordance with some embodiments.
FIG. 5B illustrates a graph of the voltage and current across a selector, in accordance with some embodiments.

However, in some cases, the threshold voltage $V_{TH}$ of an OTS selector 116 may increase as the time delay $t_D$ increases. This "time delay threshold voltage drift" is shown in FIGS. 5A and 5B, which show a representative graph of $V_{TH}$ vs. $t_D$ and a representative graph of voltage and current across an OTS selector 116, respectively. FIGS. 5A-5B are representative graphs used for explanatory purposes, and OTS selectors 116 may have different characteristics than shown. FIG. 5A illustrates an example relationship between the threshold voltage $V_{TH}$ of an OTS selector 116 and the time delay $t_D$ elapsed since the previous voltage pulse (e.g. pulse 200A of FIG. 5A). As shown in FIG. 5A, the threshold voltage $V_{TH}$ increases logarithmically with the time delay $t_D$. The increase of threshold voltage $V_{TH}$ over time may be due to factors such as atomic relaxation of the material of the OTS layer 116.

FIG. 5B shows a graph of voltage and current of an OTS selector 116 illustrating an increase in threshold voltage after a time delay $t_D$. The graph of FIG. 5B is similar to the graph of FIG. 4, except that the first pulse 200A has a threshold voltage $V_{THA}$ and, after time delay $t_D$, the second pulse 200B has an increased threshold voltage $V_{THB}$. The threshold voltage $V_{THB}$ corresponds to the threshold voltage $V_{TH}$ in FIG. 5A. In some cases, the increase in the threshold voltage $V_{TH}$ due to time delay $t_D$ can reduce efficiency or necessitate the application of pulses of higher voltages, which can increase the risk of leakage, damage, or disturbing unselected PCRAM cells 110. In some cases, the threshold voltage $V_{TH}$ of a PCRAM cell 110 may increase to a voltage large enough that a writing and/or reading operation performed on that PCRAM cell 110 fails. In some cases, a "dummy" voltage pulse similar to the pulses 200A-B may be applied between the first pulse 200A and the second pulse 200B to reset the increased threshold voltage (e.g., $V_{THB}$) to a lower voltage (e.g., $V_{THA}$) and effectively reset the time delay $t_D$ to zero. However, the application of dummy voltage pulses in this manner can unnecessarily stress a PCRAM cell 110, cause unwanted heating, and consume additional power.

Figure 6:
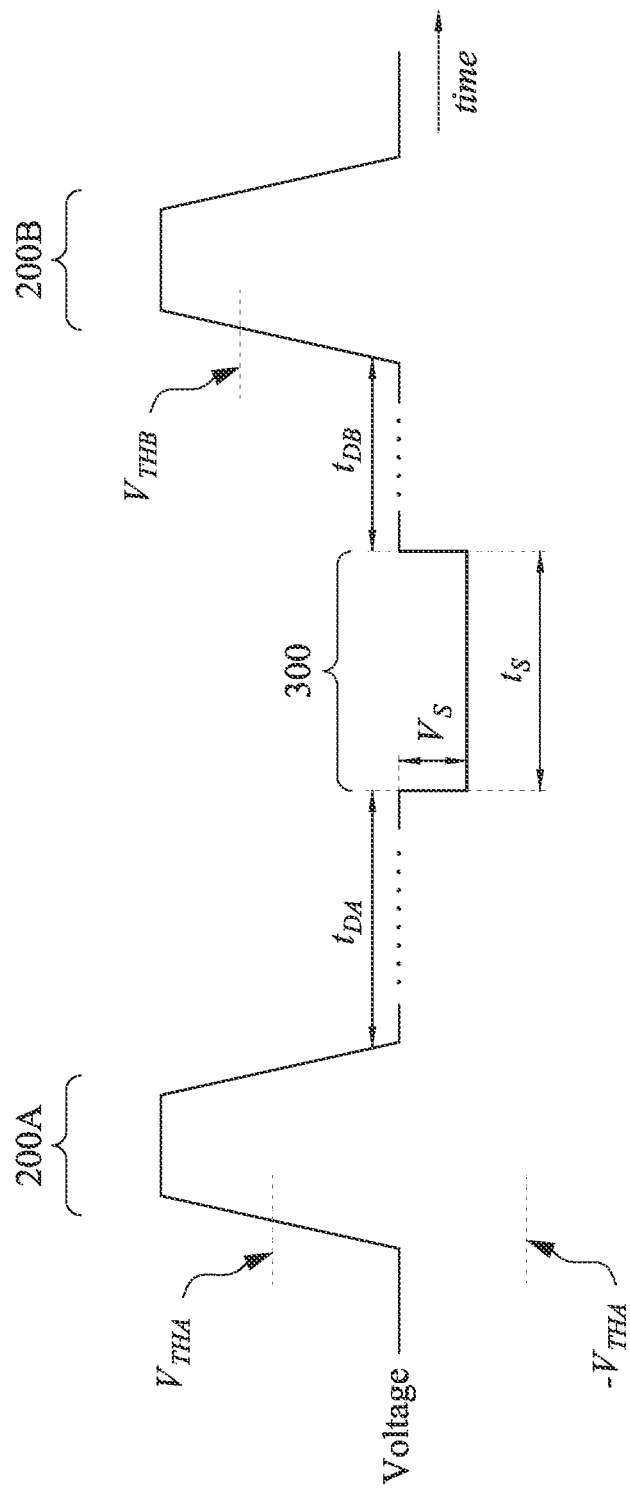
FIG. 6 illustrates a graph of the voltage across a selector including a subthreshold stress, in accordance with some embodiments.

FIG. 6 illustrates a representative graph of voltage applied across an OTS selector 116 of a PCRAM cell 110 including a subthreshold stress 300 between two voltage pulses 200A-B, in accordance with some embodiments. Applying a subthreshold stress 300 as described herein can reduce the effects of time delay threshold voltage drift, described in greater detail below. The graph of FIG. 6 is similar to the graph of applied voltage in FIG. 5B, except that a subthreshold stress 300 is applied to the OTS selector 116 at a time between the first pulse 200A and the second pulse 200B. In some embodiments, the subthreshold stress 300 comprises a pulse of voltage $V_S$ ("the stress voltage") applied to the OTS selector 116 for a duration of time $t_S$ ("the stress time"), in which the magnitude of the stress voltage $V_S$ is less than the threshold voltage $V_{THA}$ of the first pulse 200A. The stress voltage $V_S$ of the subthreshold stress 300 may have a polarity that is opposite the polarity of the pulses 200A-B, in some embodiments. For example, the pulses 200A-B may be a positive voltage and the stress voltage $V_S$ may be a negative voltage, as shown in FIG. 6. In this manner, the subthreshold stress 300 may be considered a "negative stress" or a "reverse polarity stress" in some cases. In other embodiments, the pulses 200A-B and the stress voltage $V_S$ may have the same polarity. In some cases, a subthreshold stress 300 comprising a $V_S$ having a polarity opposite that of the pulses 200A-B can improve the threshold voltage recovery effect of the subthreshold stress 300, described in greater detail below.

In some embodiments, the subthreshold stress 300 comprises a voltage pulse applied to a PCRAM cell 110 for a stress time $t_S$ that is in the range of about 1 millisecond to about 10 seconds, though other stress times are possible. The subthreshold stress 300 may comprise a stress voltage $V_S$ that has a magnitude in the range of about 0.6 V to about 1.2 V, in some embodiments. Other stress voltages are possible, and a subthreshold stress 300 may comprise multiple different stress voltages $V_S$ in other embodiments. In some embodiments, the magnitude of the stress voltage $V_S$ may be based on or determined by the magnitude of a voltage threshold $V_{TH}$ of the OTS selector 116 (e.g., $V_{THA}$ or $V_{THB}$) For example, the stress voltage $V_S$ may have a magnitude less than the magnitude of a voltage threshold $V_{TH}$ of the OTS selector 116 (e.g., $V_{THA}$ or $V_{THB}$) In some embodiments, the magnitude of $V_S$ may be between about 50% and about 80% of the magnitude of $V_{TH}$ In some embodiments, the magnitude of $V_S$ may be between about 200 mV and about 900 mV less than the magnitude of $V_{TH}$. Other relative magnitudes of $V_S$ and $V_{TH}$ are possible, and may be determined based on the magnitude of $V_{TH}$, for example. In some embodiments, the use of a subthreshold voltage pulse can reduce electrical stress on the PCRAM cell 110, reduce power consumption, and avoid unwanted switching of other PCRAM cells 110. The subthreshold stress 300 may comprise a substantially square or rectangular voltage waveform as shown in FIG. 6, or the subthreshold stress 300 may have another waveform shape such as a triangular shape, trapezoidal shape, rounded shape, stepped shape, the like, or another shape. In some embodiments, the subthreshold stress 300 is applied at a first time delay $t_{DA}$ after the first pulse 200A, and the second pulse 200B is applied at a second time delay $t_{DB}$ after the subthreshold stress 300. The time delays $t_{DA}$ and $t_{DB}$ may each be about zero microseconds or greater.

Figure 7:
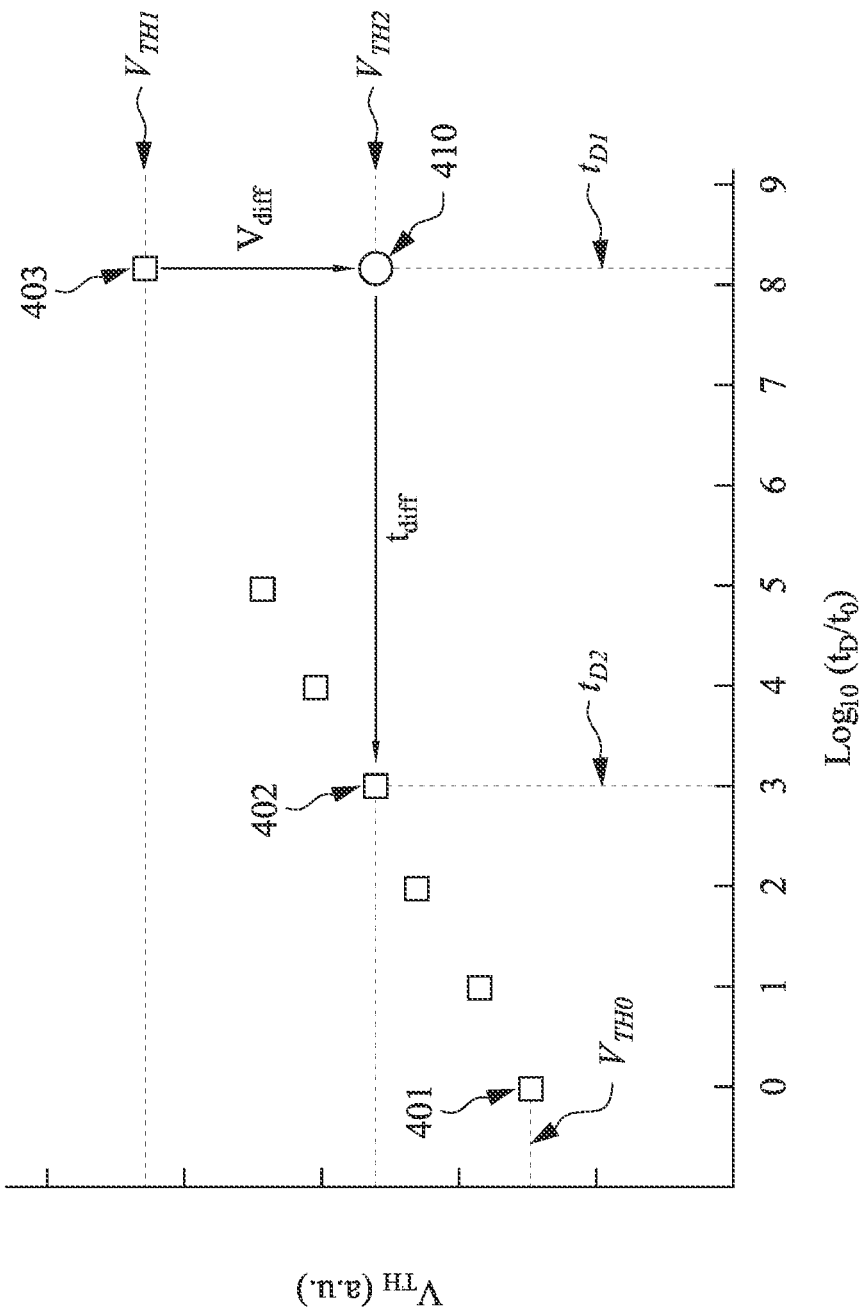
FIG. 7 illustrates a graph of threshold voltage vs. delay time of a selector, in accordance with some embodiments.

In some cases, the application of a subthreshold stress 300 as described herein can reduce the effects of time delay threshold voltage drift. This is illustrated in FIG. 7, which shows measurement data of threshold voltage $V_{TH}$ as a function of delay time $t_D$. The delay time $t_D$ is shown in a logarithmic scale $Log_{10}(t_D/t_0)$, in which to is a reference unit of delay time. The data points shown in FIG. 7 are intended as an illustrative example, and these or other threshold voltages may be present at these or other time delays in other embodiments. The square data points extending from data point 401 to data point 403 represent measurements of $V_{TH}$ for an OTS selector 116 taken after various time delays $t_D$ have elapsed. For example, the data point 403 represents a measured threshold voltage of $V_{TH1}$ taken after a delay time of $t_{D1}$. During the time delay $t_{D1}$, the threshold voltage has increased from a baseline threshold voltage of approximately $V_{TH0}$ to an "increased threshold voltage" of $V_{TH1}$. In this manner, the square data points of FIG. 7 indicate that $V_{TH}$ increases with increasing $t_D$, similar to the relationship shown previously in FIG. 5A.

The circle data point 410 represents a threshold voltage measurement taken for the same delay time $t_{D1}$ as data point 403, except the measurement of data point 410 was taken after first applying a subthreshold stress 300. The applied subthreshold stress 300 was similar to the subthreshold stress 300 described for FIG. 6. As shown in FIG. 7, applying a subthreshold stress 300 has reduced the threshold voltage from an increased threshold voltage $V_{TH1}$ to a "reduced threshold voltage" $V_{TH2}$. The magnitude of the threshold voltage reduction due to subthreshold stress 300 is indicated in FIG. 7 as $V_{diff}$. In some embodiments, after the threshold voltage of an OTS selector 116 has increased to an increased threshold voltage (e.g., $V_{TH1}$) during a time delay, the increased threshold voltage may be decreased to a reduced threshold voltage (e.g., $V_{TH2}$) by application of subthreshold stress 300. In other words, the utilization of a subthreshold stress 300 as described herein can lower the threshold voltage of an OTS selector 116 that has increased due to time delay. In this manner, applying subthreshold stress 300 can at least partially recover an increased threshold voltage towards a normal (e.g., a time delay of zero seconds) threshold voltage, and can thus reduce the effects of time delay threshold voltage drift. The data points shown in FIG. 7 are an example, and threshold voltage reduction using subthreshold stress 300 as described herein may be utilized for other time delays or threshold voltages than shown. The threshold voltage recovery benefits of subthreshold stress 300 as described herein are reproducible and repeatable, and can be implemented such that a PCRAM cell 110 experiences little or no permanent changes to operation or characteristics.

In some embodiments, the reduction of threshold voltage $V_{diff}$ has a magnitude in the range of about 50 mV to about 500 mV. In some embodiments, the magnitude of $V_{diff}$ may be between about 2% and about 40% of the magnitude of the increased threshold voltage. In some embodiments, the reduced threshold voltage may be between about 60% and about 98% of the magnitude of the increased threshold voltage. Other magnitudes or relative magnitudes are possible. The actual magnitude of threshold voltage reduction $V_{diff}$ that is achieved may depend on the parameters of the subthreshold stress 300, such as the first time delay $t_{DA}$, the second time delay tips, the stress voltage $V_S$, the stress time $t_S$, or other factors. For example, a second time delay $t_{DB}$ that is greater than about zero seconds can allow the reduced voltage threshold to increase due to time delay threshold voltage drift. As another example, a larger $V_S$ or a larger $t_S$ may result in a larger $V_{diff}$. The threshold voltage reduction $V_{diff}$ may be affected by other factors or conditions than these examples.

Still referring to FIG. 7, data point 402 shows a measurement of increased threshold voltage approximately equal to $V_{TH2}$, which corresponds to a time delay of $t_{D2}$. In this manner, the threshold voltage reduction $V_{diff}$ from $V_{TH1}$ to $V_{TH2}$ is approximately equivalent to reducing the actual time delay from tai to an effective time delay $t_{D2}$. The logarithmic difference between the actual time delay tai and the effective time delay $t_{D2}$ is shown in FIG. 7 as effective delay reduction $t_{diff}$. For the data point 410, the effective delay reduction $t_{diff}$ corresponds to a reduction of about five orders of magnitude (e.g., $t_{D2}$ is about $10^{-5} \times t_{D1}$). In other embodiments, the effective time delay reduction $t_{diff}$ may be in the range of about one order of magnitude to about 12 orders of magnitude or larger, though other values are possible.

A subthreshold stress 300 may be controlled to have a variety of characteristics. The particular characteristics of a subthreshold stress 300 may be configured for a particular application or desired result, for example. FIGS. 8A-8C, 9A, and 10A-10B illustrate graphs of voltages applied across OTS selectors 116 including subthreshold stresses 300A-F, in accordance with some embodiments. The voltage graphs shown in FIGS. 8A-10B are similar to the voltage graph shown in FIG. 6, except for described differences in the characteristics of the subthreshold stresses 300A-F. The subthreshold stresses 300A-F are intended as non-limiting examples, and a subthreshold stress 300 may have different characteristics than shown or described while still remaining within the scope of the present disclosure.

Figure 8A:
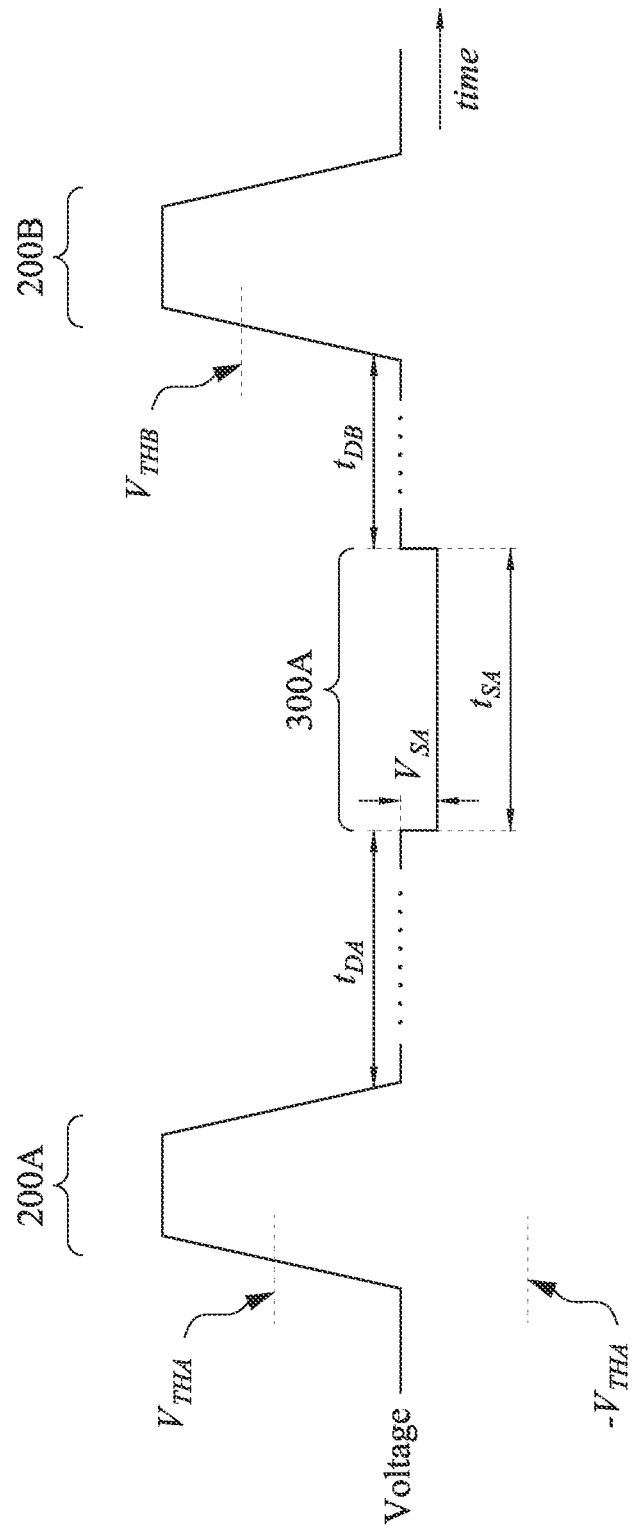
FIGS. 8A, 8B, and 8C illustrate graphs of the voltage across a selector including a subthreshold stress, in accordance with some embodiments.
Figure 8B:
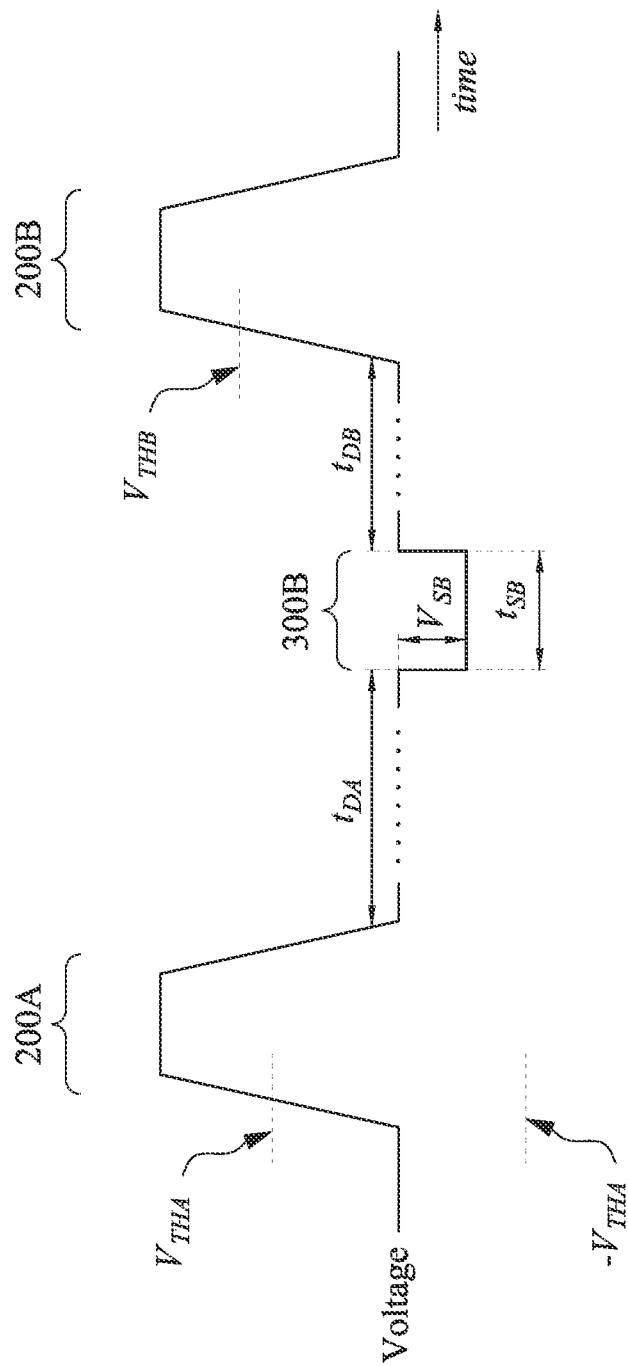

The stress voltage or stress time of a subthreshold stress 300 may be controlled to provide a suitable reduction of threshold voltage. For example, FIG. 8A illustrates a subthreshold stress 300A having a relatively small stress voltage $V_{SA}$ and a relatively long stress time $t_{SA}$. In some cases, applying a smaller magnitude of stress voltage for a longer stress time can reduce electrical stress or heating of the PCRAM cell 110. FIG. 8B illustrates a subthreshold stress 300B having a relatively large stress voltage $V_{SB}$ and a relatively short stress time $t_{SB}$. In some embodiments, a larger stress voltage or longer stress time may achieve a larger threshold voltage reduction $V_{diff}$. In some embodiments, the stress voltage or stress time may be controlled to depend on the first time delay $t_{D4}$. For example, after a longer first time delay $t_{D4}$, a subthreshold stress 300 may be controlled to have a larger stress voltage or longer stress time to achieve a larger threshold voltage reduction $V_{diff}$. In some embodiments, a similar threshold voltage reduction $V_{diff}$ may be achieved by applying a subthreshold stress 300 having a relatively small stress voltage $V_S$ and a relatively long stress time $t_S$ (e.g., similar to subthreshold stress 300A) or by applying a subthreshold stress 300 having a relatively large stress voltage $V_S$ and a relatively short stress time $t_S$ (e.g., similar to subthreshold stress 300B).

Figure 8C:
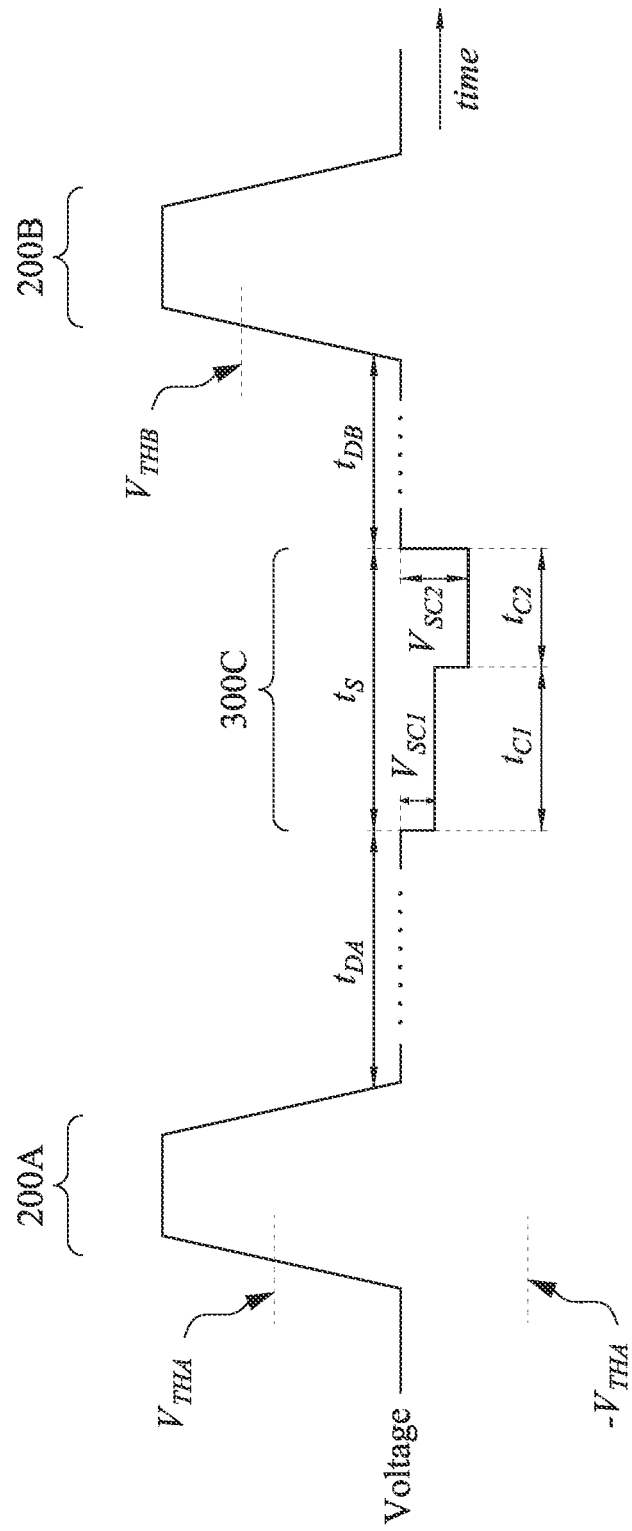

In some embodiments, a subthreshold stress 300 comprises multiple stress voltages that each may have a corresponding stress time. FIG. 8C illustrates a continuous subthreshold stress 300C that includes a first stress voltage $V_{SC1}$ followed by a second stress voltage $V_{SC2}$ that is different from $V_{SC1}$. The first stress voltage $V_{SC1}$ is applied for a stress time $t_{C1}$ and the second stress voltage $V_{SC2}$ is applied for a stress time $t_{C2}$ that is different from $t_{C1}$. A subthreshold stress 300 may comprise more than two different stress voltages in other embodiments. The various stress voltages may be sequentially arranged in any suitable order. For example, in some embodiments, the second stress voltage $V_{SC2}$ may be applied before the first stress voltage $V_{SC1}$. Any suitable sequential arrangement of multiple stress voltages within a subthreshold stress 300 may be used. The various stress voltages may have the same stress times or may have different stress times. For example, in some embodiments, the first stress voltage $V_{SC1}$ may be applied for $t_{C2}$ and the second stress voltage $V_{SC2}$ may be applied for $t_{C1}$. Any suitable stress times may be used for the various stress voltages within a subthreshold stress 300.

Figure 9A:
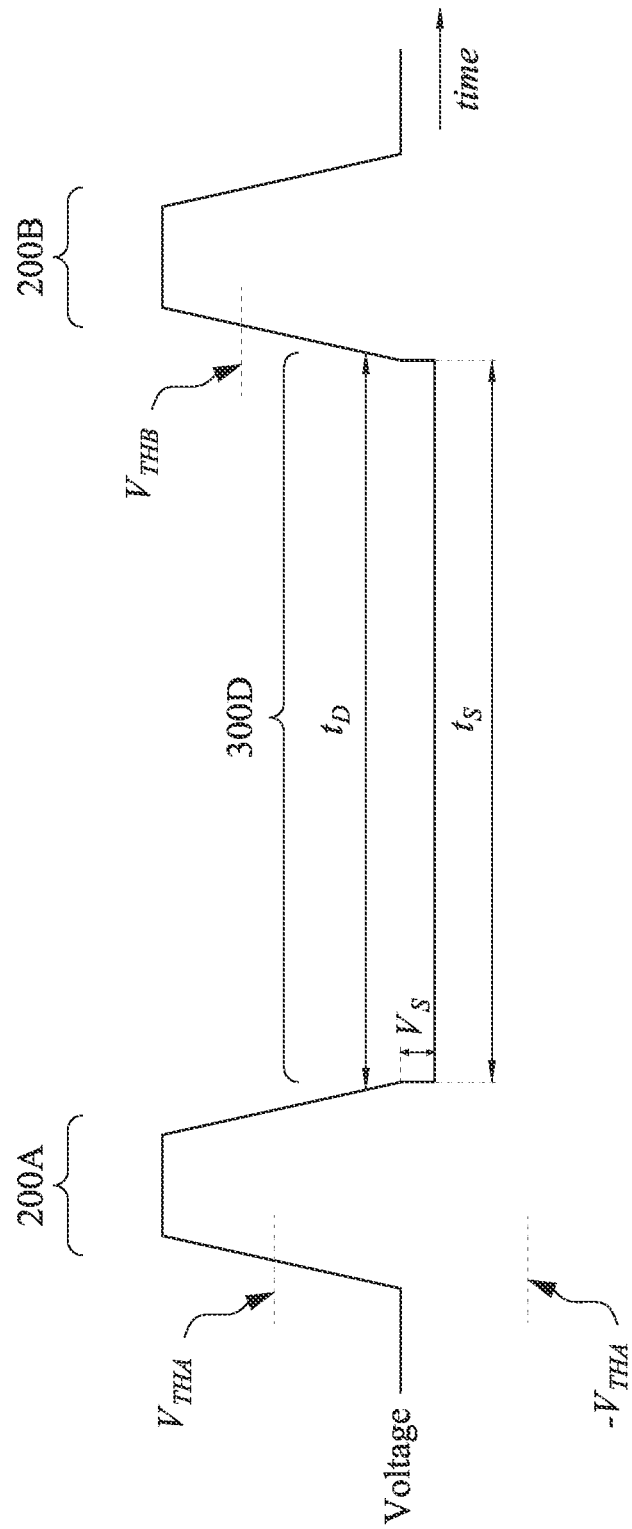
FIG. 9A illustrates a graph of the voltage across a selector including a continuous subthreshold stress, in accordance with some embodiments.

FIG. 9A illustrates a subthreshold stress 300D that is applied continuously between the first voltage pulse 200A and the second voltage pulse 200B, in accordance with some embodiments. In other words, the stress time $t_S$ of the subthreshold stress 300D is equal to the delay time $t_D$ between the pulses 200A-B. As shown in FIG. 9A, the subthreshold stress 300D may have a stress voltage polarity that is opposite from the polarity of the voltage pulses 200A-B, in some embodiments. The subthreshold stress 300D shown in FIG. 9A has a constant $V_S$, but in other embodiments the stress voltage $V_S$ may vary during application of a continuous subthreshold stress 300D. In some cases, applying a continuous subthreshold stress 300D may allow the effects of time delay threshold voltage drift to be reduced while allowing for little or no monitoring or measuring of the delay time $t_D$. Additionally, the use of a stress voltage $V_S$ that is a subthreshold voltage can reduce heating or power consumption.

Figure 9B:
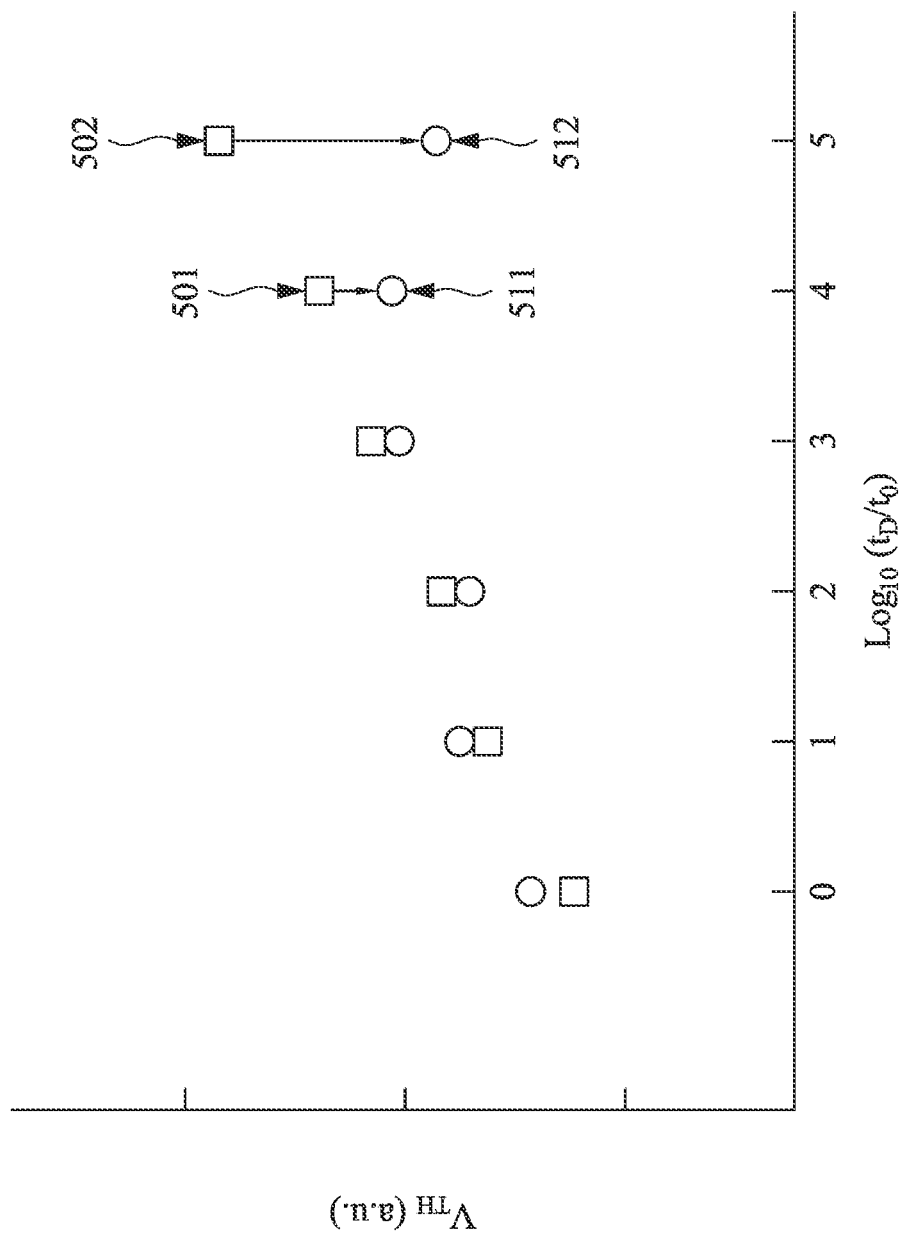
FIG. 9B illustrates a graph of threshold voltage vs. delay time of a selector, in accordance with some embodiments.

FIG. 9B shows measurement data of threshold voltage $V_{TH}$ as a function of delay time $t_D$ with and without an applied continuous subthreshold stress 300D. The delay time $t_D$ is shown in a logarithmic scale $Log_{10}(t_D/t_0)$, in which to is a reference unit of delay time. The circular data points represent measurements of threshold voltage $V_{TH}$ for an OTS selector 116 taken after various time delays $t_D$ have elapsed, with a subthreshold stress 300D continuously applied during the time delay $t_D$. The square data points represent measurements of threshold voltage $V_{TH}$ for an OTS selector 116 taken after various time delays $t_D$ have elapsed, but without any subthreshold stress applied. FIG. 9B shows that the application of continuous subthreshold stress 300D reduces the effects of time delay threshold voltage drift. For example, the application of continuous subthreshold stress 300D reduces the increased threshold voltage of data point 501 to the reduced threshold voltage of data point 511, and the application of continuous subthreshold stress 300D reduces the increased threshold voltage of data point 502 to the reduced threshold voltage of data point 512. In some cases, the application of a continuous subthreshold stress 300D can result in a greater reduction of increased threshold voltage for longer delay times $t_D$. The measurement data shown in FIG. 9B is a non-limiting example shown for explanatory purposes.

Figure 10A:
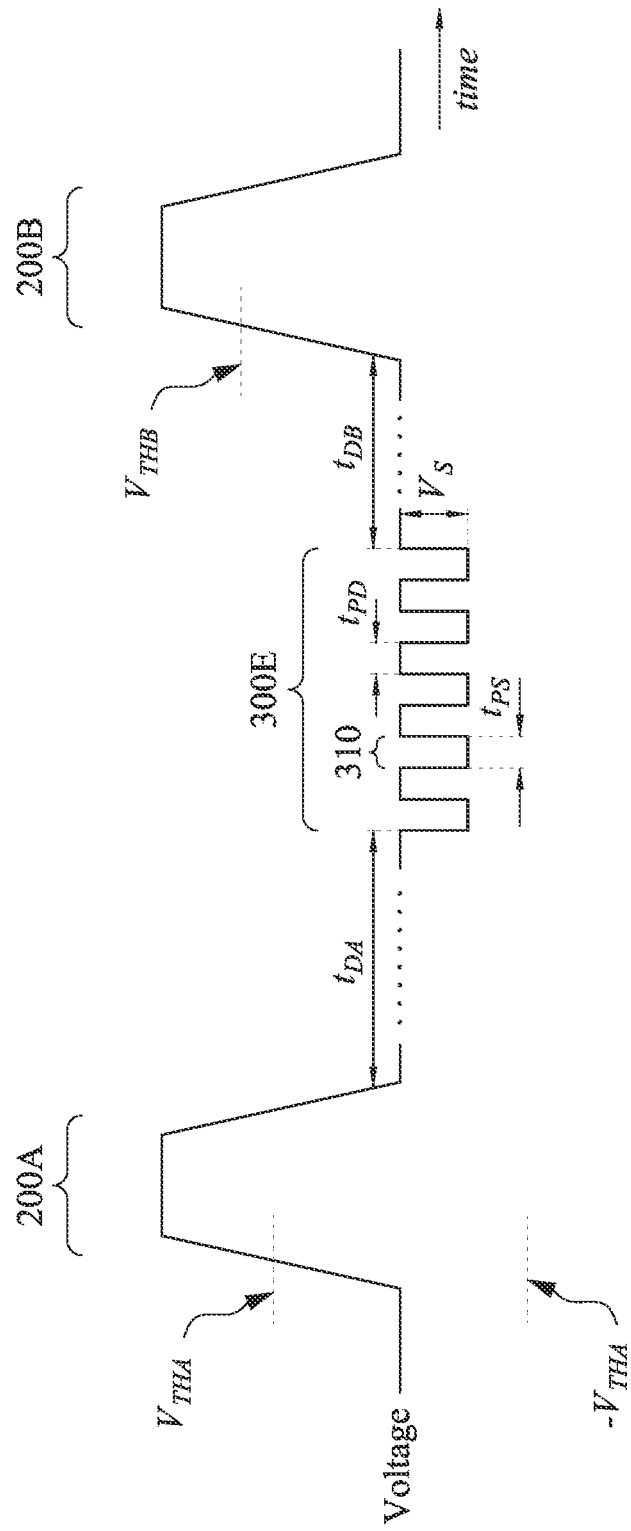
FIGS. 10A and 10B illustrate graphs of the voltage across a selector including a subthreshold stress having multiple subthreshold voltage pulses, in accordance with some embodiments.

In some embodiments, a single subthreshold stress 300 may comprise two or more subthreshold voltage pulses 310. This is shown in FIG. 10A, in which the subthreshold stress 300E is formed from a plurality of subthreshold voltage pulses 310 of stress voltage $V_S$. The subthreshold voltage pulses 310 of the subthreshold stress 300E each have a pulse stress time $t_{PS}$, and the subthreshold voltage pulses 310 are separated by a pulse delay time $t_{PD}$. The subthreshold stress 300E may have fewer or more subthreshold voltage pulses 310 than shown in FIG. 10A. In some cases, the utilization of a subthreshold stress 300E comprising multiple subthreshold voltage pulses 310 can avoid effects due to heating accumulation or electric field stress, particularly for large stress voltages $V_S$. Various characteristics of the subthreshold stress 300E may be controlled, such as the period of the subthreshold voltage pulses 310 (e.g., $t_{PS}+t_{PD}$), the duty cycle of the subthreshold voltage pulses 310 (e.g., $t_{PS}:t_{PD}$), the stress voltage $V_S$, the number of subthreshold voltage pulses 310, or other characteristics.

Figure 10B:
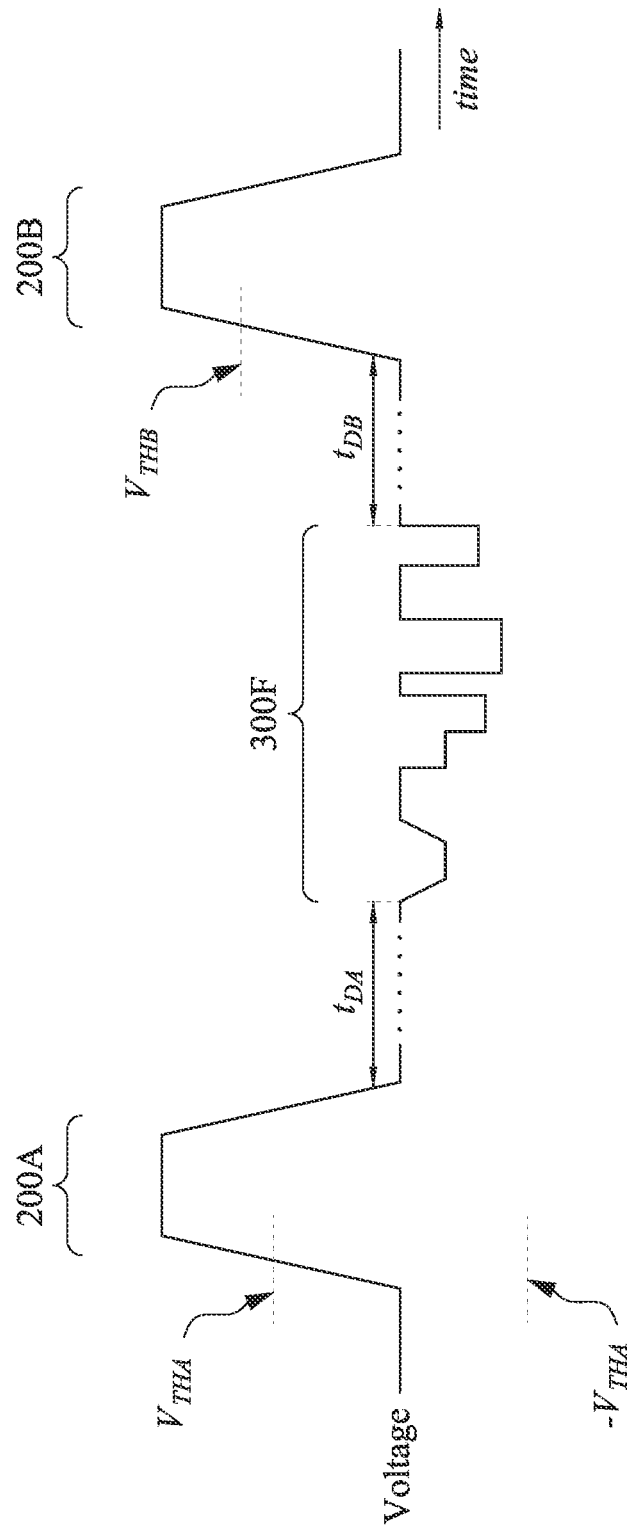

In other embodiments, a single subthreshold stress 300 may comprise multiple subthreshold voltage pulses having different stress voltages $V_S$, different pulse stress times $t_{PS}$, or different pulse delay times $t_{PD}$. A non-limiting example is shown in FIG. 10B, in which a single subthreshold stress 300F comprises multiple subthreshold voltage pulses having various different characteristics such as pulse stress time, pulse delay time, stress voltage, waveform, etc. All variations and combinations of subthreshold voltage pulses are considered within the scope of the present disclosure.

A subthreshold stress 300 as described herein may be applied to a single PCRAM cell 110 or applied in parallel to multiple PCRAM cells 110. For example, a subthreshold stress 300 may be simultaneously applied to PCRAM cells 110 that share the same word line 102 or the same bit line 104. In some cases, the use of a subthreshold stress voltage $V_S$ as described herein can reduce power consumption when applying a subthreshold stress 300 to multiple PCRAM cells 110. A subthreshold stress 300 as described herein may be applied in various ways, which may depend, for example, on a particular application, device, or device operation. For example, in some embodiments, a subthreshold stress 300 may be applied after a device (or portion of a device) is powered on or activated. In some embodiments, a subthreshold stress 300 may be if it is determined that the delay time $t_D$ is at or above a certain threshold delay time (e.g., a certain number of seconds or the like). In some embodiments, a subthreshold stress 300 may be applied periodically. In some embodiments, a subthreshold stress 300 may not be applied if the delay time $t_D$ is less than a certain threshold delay time. In some embodiments, the characteristics of the subthreshold stress 300 may be controlled based on the delay time $t_D$. For example, a smaller $t_D$ may correspond to a smaller $V_S$ or a smaller number of subthreshold voltage pulses. Other examples are possible. In some embodiments, a subthreshold stress 300 may be applied if it is determined that the threshold voltage $V_{TH}$ has increased by a certain amount of voltage or has increased to a voltage that is at or above a certain threshold voltage. Other conditions or techniques for applying or controlling a subthreshold stress 300 are possible.

In some embodiments, a subthreshold stress 300 may be applied adaptively to reduce an increased threshold voltage of a PCRAM cell 110 to a threshold voltage near or below a target threshold voltage $V_{TH0}$. This can reduce variation and put a PCRAM cell 110 in a more definite or desirable condition. In some embodiments, threshold voltage variation among multiple PCRAM cells 110 can be reduced by separately applying adaptive subthreshold stresses 300 to each of the PCRAM cells 110. In this manner, the multiple PCRAM cells 110 can all simultaneously have a threshold voltage near or below a single target threshold voltage $V_{TH0}$. This can improve the uniformity of PCRAM cells 110 in a PCRAM array 100, for example. In some cases, using an adaptive subthreshold stress process can increase the effectiveness of applying a subthreshold stress 300, optimize the stress applied to an OTS selector, or avoid over-stressing the OTS selector (e.g., stressing more than necessary). In some embodiments, a subthreshold stress 300 may be adaptively applied by repeatedly first measuring the threshold voltage of the PCRAM cell 110 and then applying a subthreshold stress 300, in which the characteristics of each applied subthreshold stress 300 are based on a difference between the target threshold voltage $V_{TH0}$ and the previously measured threshold voltage. For example, the stress voltage $V_S$ or the stress time is of an applied subthreshold stress 300 may be relatively smaller when a previously measured threshold voltage is relatively closer to the target threshold voltage $V_{TH0}$. Other techniques are possible.

Figure 11:
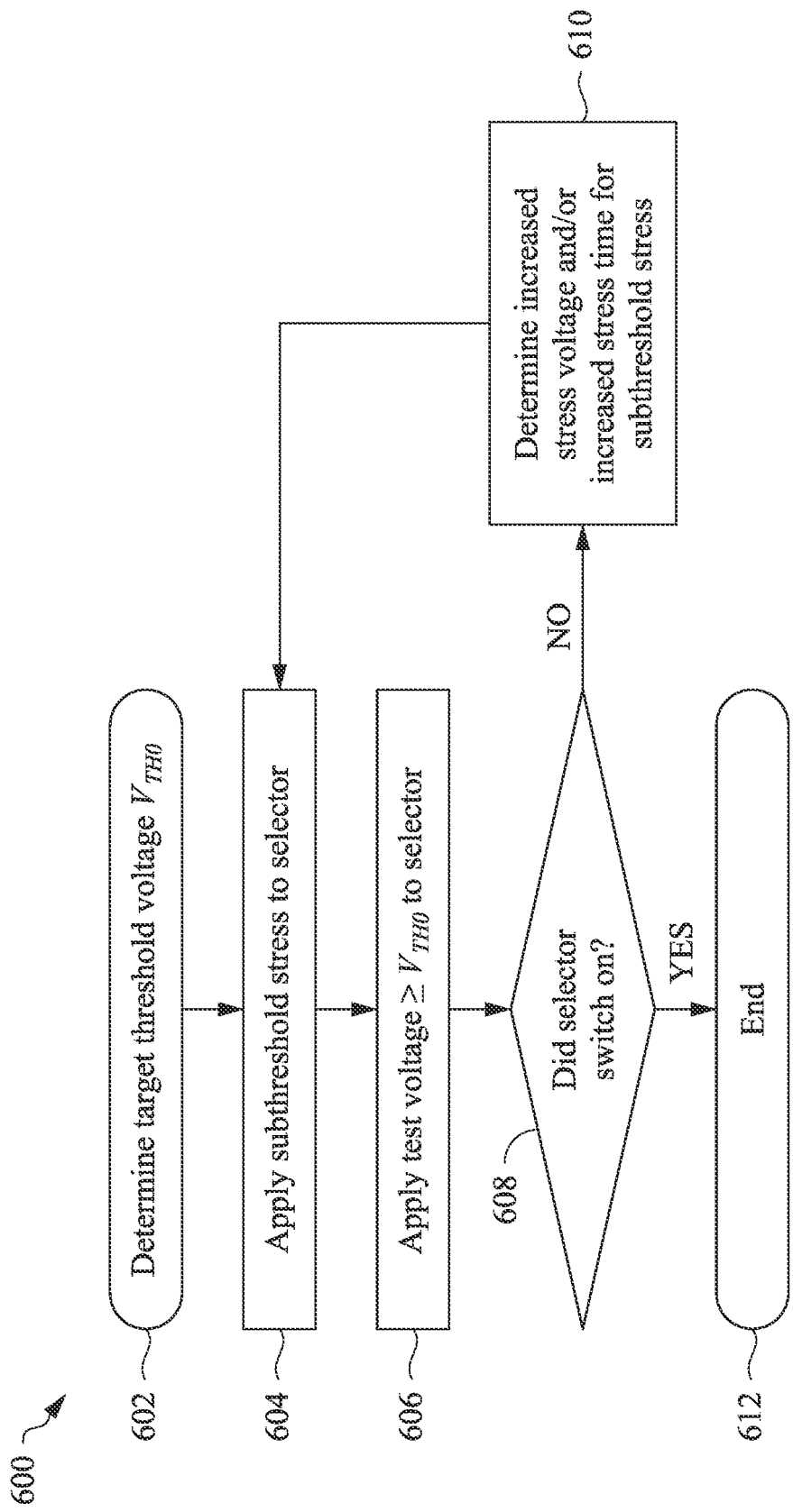
FIG. 11 illustrates a flowchart of an adaptive subthreshold stress process for a memory cell, in accordance with some embodiments.

FIG. 11 illustrates a flowchart of an adaptive subthreshold stress process 600 for a PCRAM cell, in accordance with some embodiments. At step 602, a target threshold voltage $V_{TH0}$ for the PCRAM cell is determined. The adaptive subthreshold stress process 600 may be performed, for example, to reduce the threshold voltage of a PCRAM cell below the target threshold voltage $V_{TH0}$ or to adjust the threshold voltage of a PCRAM cell to be approximately equal to the target threshold voltage $V_{TH0}$. In some cases, the adaptive subthreshold stress process 600 may be performed with the assumption that time delay threshold voltage drift has increased the threshold voltage of the PCRAM cell above the target threshold voltage $V_{TH0}$. At step 602, an initial subthreshold stress is applied to the PCRAM cell. The initial subthreshold stress may be similar to any of the subthreshold stresses described herein. For example, the initial subthreshold stress may comprise one subthreshold voltage pulse or multiple subthreshold voltage pulses, may have a stress voltage $V_S$ and a stress time $t_S$, etc. The initial subthreshold stress can reduce the threshold voltage of the PCRAM cell toward the target threshold voltage $V_{TH0}$.

At step 606, a test voltage of at or above the target threshold voltage $V_{TH0}$ is applied to the PCRAM cell. A test voltage approximately equal to the target threshold voltage $V_{TH0}$ may be applied if reducing the threshold voltage below the target threshold voltage $V_{TH0}$ is desired. A test voltage approximately equal to the target threshold voltage $V_{TH0}$ or slightly larger than the target threshold voltage $V_{TH0}$ may be applied if adjusting the threshold voltage to be approximately equal to the target threshold voltage $V_{TH0}$ is desired. If the initial subthreshold stress has sufficiently reduced the threshold voltage of the PCRAM cell, the test voltage applied at step 606 switches on the OTS selector of the PCRAM cell, bringing the OTS selector temporarily into a high-conductivity state (e.g., the "on" state).

At step 608, whether or not the OTS selector was switched on by the applied test voltage at step 606 is measured or otherwise detected. If the OTS selector was successfully switched on at step 606, then the threshold voltage of the PCRAM cell has been reduced to approximately the target threshold voltage $V_{TH0}$ or below the target threshold voltage $V_{TH0}$. In this case of successful switching, the process 600 ends at step 612.

If the threshold voltage of the PCRAM cell is still too high, then the voltage applied at step 606 is not sufficient to switch on the OTS selector, and the process 600 continues from step 608 to step 610. At step 610, new subthreshold stress characteristics are determined that may provide a larger threshold voltage reduction effect than the initial subthreshold stress. For example, in some embodiments, a new stress voltage may be determined that is larger than the stress voltage of the initial subthreshold stress, and/or a new stress time may be determined that is longer than the stress time of the initial subthreshold stress. In some embodiments, the number of subthreshold voltage pulses may be increased from the number used in the initial subthreshold stress. Other characteristic changes to determine a new subthreshold stress characteristics are possible.

After determining the new subthreshold stress characteristics in step 610, the process 600 returns to step 604 and applies a subthreshold stress with the new subthreshold stress characteristics. In some cases, new subthreshold stress characteristics are not determined at step 610, and the subthreshold stress at step 604 re-uses previously determined subthreshold stress characteristics. In other embodiments, and the subthreshold stress at step 604 always re-uses the same subthreshold stress characteristics. The process 600 then applies a test voltage at step 606 and determines if the OTS selector was switched on at step 608, as before. If the OTS selector was switched on, the process 600 ends at step 612. If the OTS selector was not switched on, new subthreshold stress characteristics are determined in step 610, which may again include increasing the stress voltage, stress time, and/or number of subthreshold voltage pulses. A subthreshold stress with the new subthreshold stress characteristics is applied at step 604, and in this manner the process 600 may continue determining new subthreshold stress characteristics until the OTS selector is successfully switched on at step 608 and the process 600 ends at step 612.

The use of a subthreshold stress to reduce the effects of time delay threshold voltage drift of a memory cell selector as described herein has advantages. The techniques described herein allow for at least a partial recovery of an increased threshold voltage of a memory cell selector toward a baseline threshold voltage, while keeping the memory cell selector in an off-state. The techniques described herein may be applied to a single selector or multiple selectors in parallel, for example, by applying the subthreshold stress to the selectors sharing the same word line or bit line. The subthreshold stress uses voltages below the voltage threshold rather than a voltage at or above the voltage threshold. This can avoid the necessity of a large voltage for threshold voltage recovery after a long delay time. The use of subthreshold voltages can reduce power consumption, reduce electric field or heating stress of the selector, or reduce the risk of switching on neighboring selectors. The subthreshold stress may have a voltage that is opposite in polarity to the selector switching voltage. The characteristics of the subthreshold stress may be configured, for example, to optimize threshold voltage recovery, improve efficiency, or minimize power consumption. In some cases, the characteristics of the subthreshold stress can be adaptively configured to provide a desired threshold voltage recovery. The techniques described herein are described for PCRAM, but may be applied to other types of non-volatile memory such as RRAM, MRAM, SOT-MRAM, or the like. The techniques described herein may be applied to a variety of memory architectures, such as 1-selector-1-resistor (1S1R) configurations, cross-point or crossbar configurations, stacked configurations of multiple layers, 3D vertical configurations, or the like. Additionally, the techniques described herein may be applied to memories comprising OTS selectors, chalcogenide selectors, or other threshold-type selectors or selector materials that exhibit time delay threshold memory drift.

In accordance with some embodiments of the present disclosure, a method includes applying a first voltage pulse across a memory cell, wherein the memory cell includes a selector, wherein the first voltage pulse switches the selector into an on-state; after applying the first voltage pulse, applying a second voltage pulse across the memory cell, wherein before applying the second voltage pulse the selector has a first voltage threshold, wherein after applying the second voltage pulse the selector has a second voltage threshold that is less than the first voltage threshold; and after applying the second voltage pulse, applying a third voltage pulse across the memory cell, wherein the third voltage pulse switches the selector into an on-state; wherein the selector remains continuously in an off-state between the first voltage pulse and the third voltage pulse. In an embodiment, the first voltage pulse and the third voltage pulse have a first voltage polarity, and the second voltage pulse has a second voltage polarity that is opposite from the first voltage polarity. In an embodiment, the second voltage pulse has a magnitude that is less than the magnitude of the first voltage threshold and less than the magnitude of the second voltage threshold. In an embodiment, the method includes applying a fourth voltage pulse after applying the first voltage pulse and before applying the second voltage pulse. In an embodiment, the selector includes a layer of GeCTe. In an embodiment, a duration of time between the first voltage pulse and the second voltage pulse is greater than one second. In an embodiment, the third voltage pulse is applied immediately after the second voltage pulse is applied. In an embodiment, the first voltage threshold is greater than the second voltage threshold by a voltage difference in the range of 50 mV to 500 mV. In an embodiment, the second voltage pulse is applied continuously from the first voltage pulse to the third voltage pulse.

In accordance with some embodiments of the present disclosure, a method includes performing a subthreshold stress process on a memory array, wherein each memory cell of the memory array includes a chalcogenide selector, wherein performing the subthreshold stress process includes applying a first voltage between a first word line and a first bit line of the memory array, wherein a first memory cell of the memory array is connected to the first word line and the first bit line, wherein at the start of the subthreshold stress process the chalcogenide selector of the first memory cell has a first threshold voltage, wherein a magnitude of the first voltage is less than the first threshold voltage, wherein at the end of the subthreshold stress process the chalcogenide selector of the first memory cell has a second threshold voltage that is smaller than the first threshold voltage. In an embodiment, performing the subthreshold stress process includes simultaneously applying the first voltage between the first word line and a second bit line of the memory array, wherein a second memory cell of the memory array is connected to the first word line and the second bit line. In an embodiment, applying the first voltage includes applying a series of pulses of the first voltage. In an embodiment, the method includes, before performing the subthreshold stress process, applying a second voltage between the first word line and the first bit line of the memory array, wherein the second voltage is greater than the first threshold voltage, wherein a polarity of the second voltage is opposite that of the first voltage, wherein no voltage is applied between the first word line and the first bit line in the time between the applying of the second voltage and the applying of the first voltage. In an embodiment, the method includes determining an elapsed time since the applying of the second voltage, wherein the applying of the first voltage is based on the elapsed time. In an embodiment, the memory array is a Phase-Change Random Access Memory (PCRAM) array.

In accordance with some embodiments of the present disclosure, a method includes determining a target threshold voltage for a chalcogenide selector; applying a first voltage pulse to the chalcogenide selector, wherein a magnitude of the first voltage pulse is less than the target threshold voltage; after applying the first voltage pulse, applying a test voltage pulse to the chalcogenide selector, wherein the magnitude of the test voltage pulse is at least the magnitude of the target threshold voltage; determining whether the test voltage pulse successfully switched the chalcogenide selector into an on-state; and based on the determining of the switching of the chalcogenide selector into an on-state, applying a second voltage pulse to the chalcogenide selector, wherein a duration of the second voltage pulse is longer than a duration of the first voltage pulse and/or a magnitude of the second voltage pulse is larger than a magnitude of the first voltage pulse. In an embodiment the method includes, based on the determining of the switching of the chalcogenide selector into an on-state, applying a third voltage pulse to the chalcogenide selector before applying the second voltage pulse. In an embodiment, the magnitude of the second voltage pulse is less than the target threshold voltage. In an embodiment, the chalcogenide selector is the selector of a memory cell of a PCRAM memory array. In an embodiment, the second voltage pulse is not applied after determining that the chalcogenide selector was successfully switched into an on-state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   applying a first voltage pulse across a memory cell, wherein the memory cell comprises a selector, wherein the first voltage pulse switches the selector into an on-state;
   after applying the first voltage pulse, applying a second voltage pulse across the memory cell, wherein before applying the second voltage pulse the selector has a first voltage threshold, wherein after applying the second voltage pulse the selector has a second voltage threshold that is less than the first voltage threshold, wherein the second voltage pulse has a magnitude that is less than a magnitude of the first voltage threshold and less than a magnitude of the second voltage threshold; and after applying the second voltage pulse, applying a third voltage pulse across the memory cell, wherein the third voltage pulse switches the selector into an on-state; wherein the selector remains continuously in an off-state between the first voltage pulse and the third voltage pulse.

2. The method of claim 1, wherein the first voltage pulse and the third voltage pulse have a first voltage polarity, and wherein the second voltage pulse has a second voltage polarity that is opposite from the first voltage polarity.

3. The method of claim 1 further comprising, after applying the first voltage pulse and before applying the second voltage pulse, applying a fourth voltage pulse.

4. The method of claim 1, wherein the selector comprises a layer of GeCTe.

5. The method of claim 1, wherein a duration of time between the first voltage pulse and the second voltage pulse is greater than one second.

6. The method of claim 1, wherein the third voltage pulse is applied immediately after the second voltage pulse is applied.

7. The method of claim 1, wherein the first voltage threshold is greater than the second voltage threshold by a voltage difference in the range of 50 mV to 500 mV.

8. The method of claim 1, wherein the second voltage pulse is applied continuously from the first voltage pulse to the third voltage pulse.

9. The method of claim 1, wherein the first voltage pulse is part of a reading operation performed on the memory cell.

10. A method comprising:
performing a subthreshold stress process on a memory array, wherein each memory cell of the memory array comprises a chalcogenide selector, wherein performing the subthreshold stress process comprises:
applying a first voltage between a first word line and a first bit line of the memory array, wherein a first memory cell of the memory array is connected to the first word line and the first bit line, wherein at the start of the subthreshold stress process the chalcogenide selector of the first memory cell has a first threshold voltage, wherein a magnitude of the first voltage is less than the first threshold voltage, wherein at the end of the subthreshold stress process the chalcogenide selector of the first memory cell has a second threshold voltage that is smaller than the first threshold voltage; and
before performing the subthreshold stress process, applying a second voltage between the first word line and the first bit line of the memory array, wherein the second voltage is greater than the first threshold voltage, wherein a polarity of the second voltage is opposite that of the first voltage, wherein no voltage is applied between the first word line and the first bit line in the time between the applying of the second voltage and the applying of the first voltage.

11. The method of claim 10, wherein performing the subthreshold stress process further comprises simultaneously applying the first voltage between the first word line and a second bit line of the memory array, wherein a second memory cell of the memory array is connected to the first word line and the second bit line.

12. The method of claim 10, wherein applying the first voltage comprises applying a series of pulses of the first voltage.

13. The method of claim 10 further comprising determining an elapsed time since the applying of the second voltage, wherein the applying of the first voltage is based on the elapsed time.

14. The method of claim 10, wherein the memory array is a Phase-Change Random Access Memory (PCRAM) array.

15. A method comprising:
determining a target threshold voltage for a chalcogenide selector, wherein the chalcogenide selector has a threshold voltage that is different than the target threshold voltage;
applying a first voltage pulse to the chalcogenide selector, wherein a magnitude of the first voltage pulse is less than the target threshold voltage;
after applying the first voltage pulse, applying a test voltage pulse to the chalcogenide selector, wherein the magnitude of the test voltage pulse is at least the magnitude of the target threshold voltage;
determining whether the test voltage pulse successfully switched the chalcogenide selector into an on-state; and
based on the determining of the switching of the chalcogenide selector into an on-state, applying a second voltage pulse to the chalcogenide selector, wherein a duration of the second voltage pulse is longer than a duration of the first voltage pulse and/or a magnitude of the second voltage pulse is larger than a magnitude of the first voltage pulse.

16. The method of claim 15 further comprising, based on the determining of the switching of the chalcogenide selector into an on-state, applying a third voltage pulse to the chalcogenide selector before applying the second voltage pulse.

17. The method of claim 15, wherein the magnitude of the second voltage pulse is less than the target threshold voltage.

18. The method of claim 15, wherein the chalcogenide selector is the selector of a memory cell of a PCRAM memory array.

19. The method of claim 15, wherein the second voltage pulse is not applied after determining that the chalcogenide selector was successfully switched into an on-state.

20. The method of claim 15, wherein the second voltage pulse has a polarity opposite to that of the test voltage pulse.

* * * * *